United States Patent [19]

Swain

[11] Patent Number: 4,685,562

[45] Date of Patent: Aug. 11, 1987

[54] RELEASABLE STOP GATE DEVICE

[75] Inventor: Henry L. Swain, Bedminster, N.J.

[73] Assignee: Illinois Tool Works Inc., Chicago, Ill.

[21] Appl. No.: 837,781

[22] Filed: Mar. 10, 1986

[51] Int. Cl.⁴ .............................................. B65D 85/46
[52] U.S. Cl. ...................................... 206/328; 206/334
[58] Field of Search ............... 206/328, 329, 330, 334; 220/3.2, 3.8

[56] References Cited

U.S. PATENT DOCUMENTS

| | | | |
|---|---|---|---|
| 3,494,651 | 2/1970 | Fork et al. | 220/3.8 |
| 4,485,531 | 12/1984 | Murphy | 206/328 |
| 4,591,658 | 5/1986 | Bauer et al. | 220/3.2 |

FOREIGN PATENT DOCUMENTS

| | | | |
|---|---|---|---|
| 2030544 | 4/1980 | United Kingdom | 206/328 |
| 2121764 | 1/1984 | United Kingdom | 206/328 |

Primary Examiner—Joseph Man-Fu Moy
Attorney, Agent, or Firm—John P. O'Brien; Thomas W. Buckman

[57] ABSTRACT

A container system includes an elongate, open-ended tubular container member defining an axis and a releasable stop device for at least one open end thereof. The releasable stop device comprises a one-piece integrally formed member having first and second legs joined along a common edge to define an acute angle. The two legs are resiliently compressible about the joined edge, and a further abutment surface extends integrally from the first leg. The second leg is formed for attachment in a generally flat, surface-to-surface condition with an outer sidewall surface of the tubular container member at an open end portion thereof, such that the first leg and the abutment surface extend retractably into the tubular container member. The invention also extends to the stop device itself.

8 Claims, 7 Drawing Figures

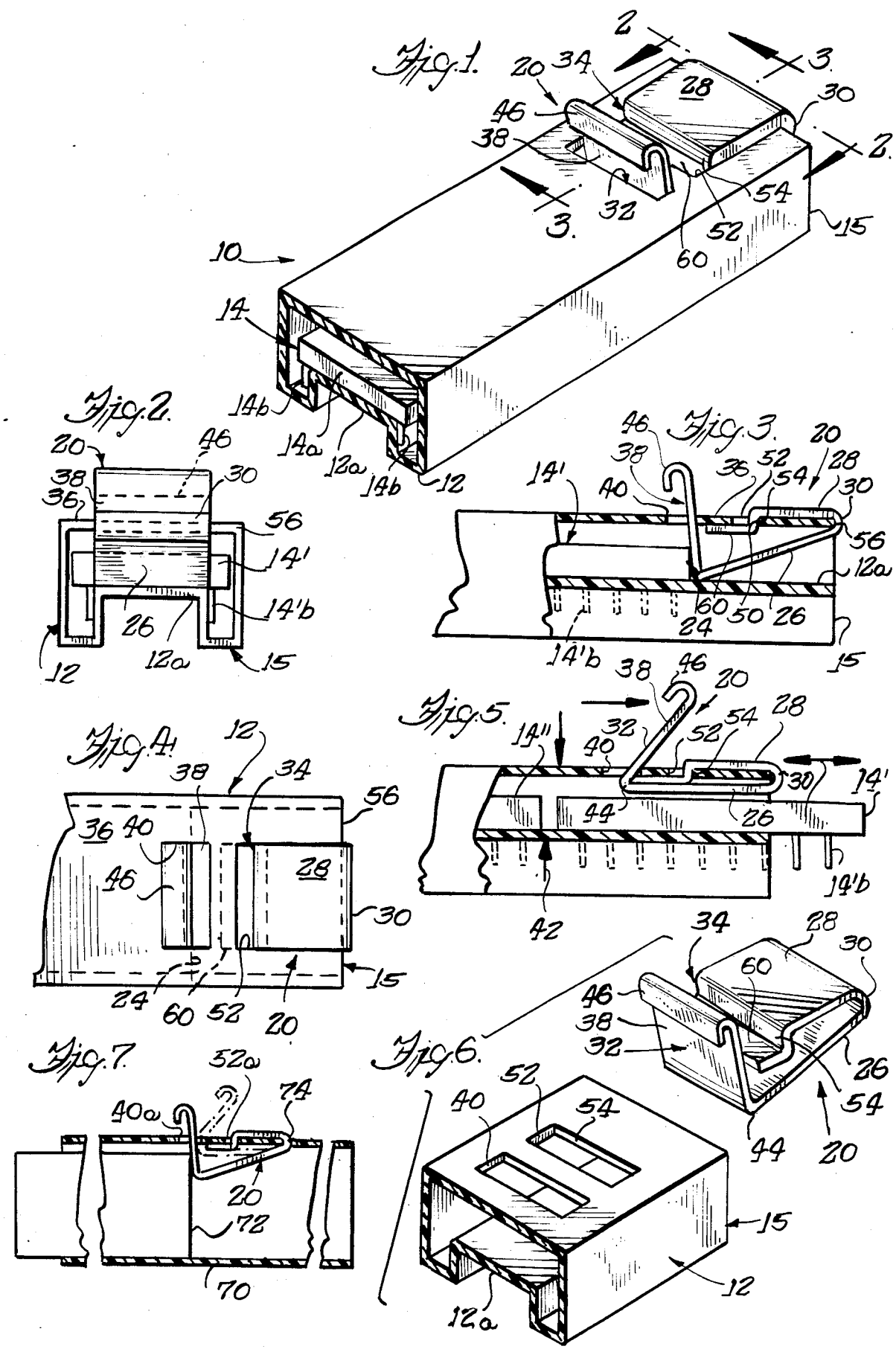

RELEASABLE STOP GATE DEVICE

BACKGROUND OF THE INVENTION

This invention is directed generally to the container arts, and more particularly to a novel magazine container system comprising tubular, open-ended container having a releasable, and preferably resilient stop gate device that serves as an end stop member for at least one end thereof, such a container system being useful for example for packaging multiple semiconductor electrical or electronic components. The invention also extends to the stop gate device itself.

In the handling, transportation and storage of multiple semiconductor electronic or electrical components such as integrated circuit components and the like, it is considered advantageous to house the semiconductor components in protective containers. One type of protective container which has gained commercial acceptance comprises an elongate tube or tubular member extruded or otherwise formed from a conductive plastic material. All or part of the tube may be of a transparent material to permit observation of the components within the tube. Generally speaking, the tube is of complementary cross-sectional dimensions for receiving the bodies of the electronic semiconductor components in side-by-side or end-to-end abutting condition with projecting leads or terminals thereof contacting the conductive plastic material of an interior wall of the tube.

Such tubes are preferably made from a continuously extruded or otherwise continuously formed tubular material, by cutting the tubular material to desired lengths to define individual containers for packaging desired numbers of components. Accordingly, suitable end stops must be additionally provided to close off the ends of the tubular container once the desired number of components has been loaded therein. In this regard, such end stops are generally spaced by some integral number of widths or lengths of the components to be packed side by-side or end-to-end therein, so as to abut an outwardly facing surface of the component at either end.

One such closure device which has been utilized consists of a relatively thin post or pin-like member traversing an interior dimension of the tube and preferably substantially centered within the tube. Preferably, the pin includes opposite head and tip portions of enlarged diameter for engaging opposite outer surfaces of the tube to hold the pin in place. Suitable aligned through apertures are provided at opposite ends of the tube for receiving these pins.

Such an arrangement is shown, for example, in U.S. Pat. No. 4,485,531 to Murphy.

Another end stop arrangement is shown in U.S. Pat. No. 4,037,267 to Kisor. This arrangement involves forming a partially cut-out flap in the material of one of the sides of the tubular container near the end, and pressing the flap thus defined into the container interior so as to define a stop near either end thereof for the components. Such cut-out flap members are preferably located some integral number of component lengths or widths apart for the same reasons discussed above.

It will be appreciated that the foregoing pin or post type of stop member must be physically removed from at least one end of the tube to permit the loading and unloading of components. Similarly, the cut-out or flap type of arrangement must also be retracted or otherwise moved so as not to block access to the interior of the tube for loading and unloading of components. The pin type of stop member, once removed may be lost or misplaced or otherwise damaged during handling. On the other hand, the flap member is relatively difficult to locate and manipulate, especially when the only protruding portion thereof is interior to the tube itself. Hence, some tool or other object must be inserted in the tube to push the end back outwardly thereof for loading and unloading of components. Moreover, such a flap-like member is normally made by physically deforming a portion of the tube sidewall such that it is connected with the tube only along one bent-over edge. Repeated flexing or movement of the flap member about this edge may cause fracture and failure of the connection and either failure of the stop member to remain in its desired position as an end stop, or physical detachment thereof.

Moreover, the end stop arrangements of the above-cited U.S. patents of necessity must leave some additional space or play to assure adequate space within the container for loading the desired number of components therein. However, such additional space or play also permits some relative movement of the components axially within the tubular container during shipping and handling. Such relative movement, jostling or the like may possibly cause some damage to the components. However, the arrangements shown in the prior art make no provision to control or absorb any shock to which the components may be subjected during normal handling.

OBJECTS AND SUMMARY OF THE INVENTION

According, it is a general object of the invention to provide a novel and improved magazine container system comprising an elongate tubular container including a releasable end stop gate device for electronic components housed therewithin.

A more specific object is to provide a releasable stop gate device for a magazine container system in accordance with the foregoing object which need not be removed from the tube to permit loading and unloading of components.

A further object is to provide a stop device designed to be relatively easily engaged or released from its stop position to either prevent or permit slideable movement of an element or object relative to the interior of tubular container.

A related object is to provide a releasable stop gate device in accordance with the foregoing objects which is relatively simple and inexpensive in its design and manufacture and yet highly reliable in operation.

A related object is to provide a stop gate device in accordance with the foregoing objects which additionally resiliently, positively presses against facing surfaces of respective outermost ones of the semiconductor electronic components housed within the tube so as to minimize movement of the components relative to the interior of the tube and also to absorb some amount of shock or pressure which may be applied to the container and/or components during normal handling thereof.

Briefly, and in accordance with the foregoing objects, a magazine container system in accordance with the invention comprises an elongate, open-ended tubular member and a releasable end stop gate device for at least one open end thereof, said end stop gate device comprising a one-piece integrally formed member having first and second legs joined along a common edge to define an acute angle, said legs being resiliently compressible about said joined edge, abutment surface means extending from an end of said first leg opposite said joined edge, and attachment means formed on said second leg for attachment of said second leg in a generally flat, surface-to-surface engagement with an outer sidewall surface at an end portion of said tubular member, such that the first leg and abutment surface means extend retractably into an interior portion of the tubular member.

The invention also contemplates the use of the releasable stop gate device in connection with other apparatus.

BRIEF DESCRIPTION OF THE DRAWINGS

The features of the present invention which are believed to be novel are set forth with particularity in the appended claims The organization and manner of operation of the invention, together with further objects and advantages thereof, may best be understood by reference to the following description taken in connection with the accompanying drawings in the several figures of which like reference numerals identify like elements, and in which:

FIG. 1 is a partially cut away perspective view illustrating a portion of a tubular carrier having electronic components therein, and provided with a releasable end stop gate device in accordance with the invention;

FIG. 2 is an end view taken generally in the plane of line 2—2 of FIG. 1;

FIG. 3 is a partial sectional view taken generally in the plane of line 3—3 of FIG. 1;

FIG. 4 is a partial top plan view of FIG. 1;

FIG. 5 is a partial sectional view similar to FIG. 3 showing release of the releasable stop gate member thereof during the loading and/or unloading of components;

FIG. 6 is an exploded partial perspective view illustrating an end part of the tubular container of and the releasable stop gate device of the invention immediately prior to assembly thereof; and FIG. 7 is a view of a pair of telescopically engaged members, in connection with which the stop gate device of the invention may also be utilized.

DETAILED DESCRIPTION OF THE ILLUSTRATED EMBODIMENT

Referring now to the drawings, and initially to FIG. 1, a magazine container system tubular container for multiple semiconductor packages having a releasable stop gate device in accordance with the invention is indicated generally by the reference numeral 10. The magazine container system 10 includes an elongate tubular container member or container portion 12. This tubular member or container portion 12 may be formed from Zn extrusion or other continuously formed tubular material for example, by cutting the material to desired lengths to define containers of suitable lengths for holding a desired number of electrical components such as electrical semiconductor component 14. That is, the length of magazine container 12 is selected so as to accommodate some desired number of semiconductor components 14 in a side-by-side or end-to-end abutting condition within the magazine container 12.

In the embodiment illustrated for purposes of description, the tubular member 12 is generally of a U-shaped configuration whereby a body portion 14a of each electrical component 14 may rest upon an inwardly projecting or inwardly extending wall portion 12a thereof while respective projecting leads or terminals 14b may engage or otherwise extend to either side of wall portion 12a. Moreover, the container 12 may be formed from an electrically conductive plastics material, such that the projecting leads or terminals 14b are held in contact with this electrically conductive material so as to avoid the buidup of static electric charges.

In accordance with an important feature of the invention, at least one of the open ends of the open-ended container 12 is provided with a releasable stop gate member 20. That is, this stop gate member, as will be more fully described hereinbelow, may be alternatively extended and retracted relative to the interior of the tube so as to alternatively form an end stop for holding the components 14 therein, and permitting the loading and unloading of the components 14 relative to the tube. The opposite end of the tube may contain a similar retractable stop member, or some other suitable end-defining stop arrangement, without departing from the invention.

As will be more fully appreciated later herein, the end stop member gate 20 is also of a resilient nature so as to impart some amount of positive, resilient force against the facing surface of an end-most component, for example, surface 24 of component 14' as best viewed in FIG. 3. Advantageously, this resilient, positive force of engagement helps to absorb some degree of physical shock or other external forces or pressures to which the components may be subjected during normal handling of the container.

Referring now to the remaining drawings, the releasable stop gate device 20 will be seen to comprise a one-piece integrally formed member having first and second legs 26, 28 joined along a common edge 30 thereof to form an acute angle. Abutment surface means in the form of an additional or further leg 32 extends from the first leg 28 at an end thereof opposite the joined common edge or corner 30. This abutment surface 32 is positionable relative to the interior of the container for resiliently abutting facing surface 24 of an end-most component 14' as mentioned above.

In accordance with a further feature of the invention, attachment means, designated generally by reference numeral 34 are formed on a second leg for attachment thereof to the container in a generally flat condition against an outer sidewall surface 36 of the container 12. This attachment of the stop gate device 20 to the container 12 is at a location adjacent its outer open or free end 15, such that the first leg 26 and abutment surface 32 extend retractably into the interior of the container 12.

In accordance with a further feature of the invention, a gripping means or grasping portion 38 extends generally outwardly of the abutment surface 32 and is adapted to extend through an aligned first through opening or aperture 40 in the container sidewall surface 36. In this way, the grasping portion 38 may be grasped and pulled or pushed generally away from the sidewall 36 as best viewed in FIG. 5, to effect resilient compression of the leg 26 into a substantially flat condition against an inner surface of the sidewall 36. This results in retraction of the abutment surface 32 upwardly through the aperture 40 so as to permit the loading and/or unloading of the components 14 relative to the container as illustrated in FIG. 5.

In the preferred embodiment illustrated for purposes of description, the grasping portion 38 is formed generally as a flat continuous extension of the abutment surface or leg 32. These two portions together define a member of a length greater than a transverse dimension of the tubular container 12a as generally defined by arrows 42 in FIG. 5, to assure extension of the grasping portion 38 outwardly through the aperture 40 at all times. In this regard, it will be seen (see FIG. 6) that the abutment surface is formed substantially at a right angle to the leg 26 along a common edge 44. As with the joinder of the two legs 26, 28 along edge or corner 30, this latter edge or corner 44 defines a flexible joint between leg 26 and abutment surface 32, whereby the abutment surface 32 is resiliently deflectable to assume other angular orientations relative to the leg 26. It is this resiliently deflectable nature of abutment surface 32 which provides some resilient positive pressure against facing surface 24 of the endmost component 14' as mentioned above, to serve in a shock-absorbing capacity.

In the illustrated embodiment, the grasping portion also includes a second, gripping part 46, which defines a reverse, hook-like bend at an outer end of its extension from abutment surface 32 to further facilitate positive gripping thereof to effect resilient deformation or compression of the stop gate device to its retracted position as shown in FIG. 5.

The attachment means 34 will be seen to comprise a shoulder portion 54 which extends normally or at generally right angles inwardly from the leg 28, that is, generally in the direction of leg 26. This shoulder portion 54 thereby extends through and grips an internal edge 50 of a second through aperture 52 formed through the sidewall surface 36. This second through aperture is spaced axially outwardly of the first through aperture 40, that is, in the direction of the open end 15 of the tubular container. Moreover, the edge surface 50 of the through aperture 52 comprises the axially outermost edge thereof relative to the container. The effective length of the second leg 28 between common edge portion 30 and shoulder 34 is similar to the spacing between this through aperture edge 50 and an axially outer free edge 56 of the tubular container 12. This then facilitates the gripping engagement of the stop member with the container, and more particularly, engagement of the container on outer edge 56 and aperture edge 50 by and between the common joined edge or corner 30 and shoulder portion 54.

The attachment means 34 further includes an additional outwardly extending lip portion 60 which extends normally or at right angles to the shoulder portion 54. The effective height of shoulder portion 54 is similar to the thickness of sidewall portion 36, such that this lip portion underlies and abuts an inner surface portion of the container adjacent the through aperture 52. In the embodiment illustrated, this lip 60 extends axially inwardly of the container for abutting an inner surface of the sidewall 36 intermediate the two apertures 40 and 52.

From the foregoing, it will be seen that the resilient stop gate member 20 may be readily interfitted with the through apertures 40 and 52 provided in the container sidewall or top wall 36. Thereafter, the resilient nature of the legs 26, 28 and abutment surface or leg 32 are such as to position the common edge or corner 44 generally pressed against the inwardly extending surface portion 12a of the container. Accordingly, abutment surface 32 forms a resilient stop surface for contacting a facing end 24 of endmost electrical component 14' in the fashion described above. Moreover, the provision of the shoulder 54 and lip 60 effectively holds the stop device in place relative to the container, once assembled therewith and substantially resists any external forces such as vibration or the like which might otherwise tend to dislodge the stop gate device 20.

Referring to FIG. 7, as indicated hereinabove, the stop gate device of the invention may be useful in connection with other applications as well. For example, the stop gate device 20 may be used to alternately permit or prevent relative movement of any object or element relative to the interior of a tubular member or container, or some other member having an open interior. In FIG. 7, the stop gate device 20 is illustrated in connection with controlling relative slideable movement of a pair of telescopically mounted members 70, 72. In this regard, the one member 70 may be tubular or otherwise have a hollow interior to receive the member 72 telescopically therewithin. The member 72 may be tubular, solid or of any other desired configuration. It will be appreciated that the word "tubular" in the sense utilized herein refers to any member having a generally open or hollow interior.

In operation, a selected wall portion of the member 70 is provided with a pair of through apertures 40a, 52a in the same configuration and arrangement as the through apertures 40 and 52 described hereinabove. Moreover an additional through aperture 74 may be provided in this same surface of member 70, located and positioned to provide an edge surface equivalent to edge 56 discussed above for engaging the edge or corner 30 of the stop gate device 20. Accordingly, it will be seen that the stop gate device 20 may be alternatively relaxed in its extended position or collapsed as indicated in phantom line, to alternately prevent and permit further slideable movement of element 72 relative to element 70.

While particular embodiments of the invention have been shown and described in detail, it will be obvious to those skilled in the art that changes and modifications of the present invention, it its various aspects, may be made without departing from the invention in its broader aspects, some of which changes and modifications being matters of routine engineering or design and others being apparent only after study. As such, the scope of the invention should not be limited by the particular embodiment and specific construction described herein but should be defined by the appended claims and equivalents thereof. Accordingly, the aim in the appended claims is to cover all such changes and modifications as fall within the true spirit and scope of the invention.

The invention is claimed as follows:

1. In combination, a magazine for multiple semiconductor packages comprising an elongated tubular member having an interior cross-sectional configuration adapted to confine in sliding orientation semiconductor packages, said tubular member having two spaced apart through apertures formed through its upper sidewall adjacent one open end of said tubular member; and a releasable stop gate device comprising a one-piece integrally formed member having first and second legs joined along a common edge to define an acute angle, said legs being resiliently compressible about said joined edge, abutment surface means extending from an end of said first leg opposite said joined edge, and attachment means formed on the outer free end of said second leg for extending through and gripping one of said spaced apart through apertures to effect attachment of said second leg in a generally flat, surface-to-surface engagement with said upper sidewall surface adjacent said one open end of said tubular container, such that the first leg and abutment surface means extend retractably into the tubular container member, said stop gate device further includes gripping means extending from said abutment surface means and extending through the other of said spaced apart apertures for receiving said gripping means therethrough to be grasped and pulled generally away from said sidewall to effect resilient compression of said first leg into a substantially flat condition against an inner surface of said upper sidewall, thereby retracting said abutment surface means from the interior of said tubular container member.

2. The combination of claim 1 wherein said abutment surfaces means is formed substantially at a right angle to said first leg and is resiliently deflectable to other angular orientations relative thereto.

3. The combination of claim 1 wherein said grasping portion includes a first extension part formed as a substantially flat continuous surface with said abutment surface and of sufficient length to define, together with said abutment surface, a length greater than a transverse dimension of said tubular container member to assure extension of said grasping portion outwardly through said first through aperture.

4. The combination of claim 1 wherein said grasping portion includes a second gripping part defining a reverse, hook-like bend at an outer end of said first extension portion for positively gripping to effect said resilient compression of said first leg.

5. The combination of claim 1 wherein said attachment means comprises a shoulder portion extending normally inwardly from said second leg in the direction of said first leg for extending through and gripping an edge of said one through aperture.

6. A container system according to claim 5 wherein said edge of said one thorugh aperture comprises an axially outer edge thereof relative to said container open end and wherein the length of said second leg is similar to the spacing between said through aperture edge and an axially outer free edge of said tubular container member at said open end thereof to facilitate gripping engagement of said outer free edge and said one aperture edge by and between said joined edge and said shoulder portion respectively of said stop device.

7. A container system according to claim 5 wherein said attachment means further includes a lip extending normally to said shoulder portion for underlying and abutting an inner surface portion of said container adjacent said one through aperture.

8. A container system according to claim 7 wherein said lip extends axially inwardly for abutting the inner surface of said container intermediate said two apertures.

* * * * *